(12) United States Patent
Tuttle et al.

(10) Patent No.: US 6,781,508 B2
(45) Date of Patent: *Aug. 24, 2004

(54) RADIO FREQUENCY DATA COMMUNICATIONS DEVICE WITH ADJUSTABLE RECEIVER SENSITIVITY AND METHOD

(76) Inventors: Mark E. Tuttle, 1998 Table Rock Rd., Boise, ID (US) 83712; John R. Tuttle, 5514 W. Lake River La., Boise, ID (US) 83703

(*) Notice: Subject to any disclaimer, the term of this patent is extended or adjusted under 35 U.S.C. 154(b) by 0 days.

This patent is subject to a terminal disclaimer.

(21) Appl. No.: 10/315,427

(22) Filed: Dec. 9, 2002

(65) Prior Publication Data

US 2003/0080853 A1 May 1, 2003

Related U.S. Application Data

(60) Continuation of application No. 09/961,204, filed on Sep. 21, 2001, now Pat. No. 6,509,837, which is a division of application No. 08/708,164, filed on Aug. 29, 1996, now Pat. No. 6,466,131.
(60) Provisional application No. 60/023,321, filed on Jul. 30, 1996.

(51) Int. Cl.[7] ................................. H04Q 1/00
(52) U.S. Cl. .................... 340/10.1; 345/572.7; 343/795
(58) Field of Search .......................... 340/572.7, 10.1, 340/573.1, 572.1, 572.2, 10.2; 343/795

(56) References Cited

U.S. PATENT DOCUMENTS

| | | |
|---|---|---|
| 3,155,954 A | 11/1964 | Larrick et al. |
| 3,967,202 A | 6/1976 | Batz |
| 4,075,632 A | 2/1978 | Baldwin et al. |
| 4,167,010 A | 9/1979 | Kerr |
| 4,215,341 A | 7/1980 | Cole ........................ 340/552 |
| 4,470,047 A | 9/1984 | Vogt et al. |
| 4,572,976 A | 2/1986 | Fockens |
| 4,724,427 A | 2/1988 | Carroll |
| 4,822,990 A | 4/1989 | Tamada et al. |
| 4,825,220 A | 4/1989 | Edward |

(List continued on next page.)

OTHER PUBLICATIONS

"*CMOS Analog Integrated Circuits Based on Weak Inversion Operation*", by Eric Vittoz and Jean Fellrath, IEEE Journal of Solid State Circuits, vol. SC–12, No. 3, Jun. 1977.
Mitsubishi Motors Corporation Web Page, 1995.
"*Digital RF/ID Enhances GPS*", by John R. Tuttle, Proceedings of the Second Annual Wireless Symposium, pp. 406–411, Feb. 15–18, 1994, Santa Clara, CA.
"*Micron Morning Report*", The Idaho Statesman, Jul. 16, 1993.

(List continued on next page.)

Primary Examiner—Brian Zimmerman
(74) Attorney, Agent, or Firm—Wells St. John P.S.

(57) ABSTRACT

An adjustable radio frequency data communications device has a monolithic semiconductor integrated circuit with integrated circuitry, interrogation receiving circuitry provided on the monolithic integrated circuit forming at least part of the integrated circuitry and configured to receive an interrogation signal from the interrogator unit, an antenna electrically coupled to the interrogation receiving circuitry and configured to communicate with the remote interrogator unit, a power source electrically coupled to the integrated circuitry and configured to generate operating power for the communications device, and at least one of the antenna and the interrogation receiving circuitry having reconfigurable electrical characteristics, the electrical characteristics being reconfigurable to selectively tune the at least one of the antenna and the interrogation receiving circuitry within a range of tuned and detuned states to realize a desired receiver sensitivity of the communications device.

23 Claims, 8 Drawing Sheets

U.S. PATENT DOCUMENTS

| | | |
|---|---|---|
| 4,854,328 A | 8/1989 | Pollack |
| 4,856,082 A | 8/1989 | Kasa ........................... 455/161 |
| 4,857,893 A | 8/1989 | Carroll |
| 4,862,160 A | 8/1989 | Ekchian et al. |
| 4,870,419 A | 9/1989 | Baldwin et al. |
| 4,888,591 A | 12/1989 | Landt et al. |
| 4,890,072 A | 12/1989 | Espe et al. |
| 4,912,471 A | 3/1990 | Tyburski et al. |
| 4,926,182 A | 5/1990 | Ohta et al. |
| 4,999,636 A | 3/1991 | Landt et al. .................. 342/90 |
| 5,030,807 A | 7/1991 | Landt et al. ................. 235/375 |
| 5,086,290 A | 2/1992 | Murray |
| 5,086,389 A | 2/1992 | Hassett et al. |
| 5,119,070 A | 6/1992 | Matsumoto |
| 5,134,085 A | 7/1992 | Gilgen et al. |
| 5,144,314 A | 9/1992 | Malmberg et al. |
| 5,164,985 A | 11/1992 | Nysen et al. |
| 5,175,774 A | 12/1992 | Truax et al. |
| 5,272,367 A | 12/1993 | Dennison et al. |
| 5,280,643 A | 1/1994 | Ishii ........................... 455/254 |
| 5,287,112 A | 2/1994 | Schuermann |
| 5,300,875 A | 4/1994 | Tuttle |
| 5,323,150 A | 6/1994 | Tuttle |
| 5,365,551 A | 11/1994 | Snodgrass et al. |
| 5,374,930 A | 12/1994 | Schuermann |
| 5,406,263 A | 4/1995 | Tuttle |
| 5,420,757 A | 5/1995 | Eberhardt et al. |
| 5,432,027 A | 7/1995 | Tuttle et al. ................. 429/127 |
| 5,448,242 A | 9/1995 | Sharpe et al. |
| 5,461,385 A | 10/1995 | Armstrong |
| 5,471,212 A | 11/1995 | Sharpe et al. |
| 5,479,172 A | 12/1995 | Smith et al. |
| 5,480,834 A | 1/1996 | Lake et al. .................. 437/183 |
| 5,489,546 A | 2/1996 | Ahmad et al. |
| 5,494,495 A | 2/1996 | Tuttle ........................ 29/623.2 |
| 5,495,260 A | 2/1996 | Couture |
| 5,500,650 A | 3/1996 | Snodgrass et al. |
| 5,521,600 A | 5/1996 | McEwan |
| 5,525,993 A | 6/1996 | Pobanz et al. |
| 5,532,707 A | 7/1996 | Klinger |
| 5,621,412 A | 4/1997 | Sharpe et al. |
| 5,626,630 A | 5/1997 | Markowitz |
| 5,649,296 A | 7/1997 | MacLellan et al. |
| 5,668,560 A | 9/1997 | Evans et al. |
| 5,970,398 A | 10/1999 | Tuttle ....................... 455/193.1 |
| 6,122,494 A | 9/2000 | Tuttle ....................... 455/193.1 |
| 6,574,454 B1 | 6/2003 | Tuttle .......................... 455/41 |

OTHER PUBLICATIONS

"A Low–Power Spread Spectrum CMOS RFIC for Radio Identification Applications", by John R. Tuttle, Conference Proceedings from RF Expo West, pp. 216–222, Mar. 22–24, 1994, San Jose, CA.

*Electronics Engineer's Handbook—3 $^{rd}$ Ed.*, Fink et al., *Distributed Circuits*, §100, p. 8–104, ©1989.

U.S. patent application Ser. No. 60/017,900, Provisional Patent Application, filed May 13, 1996.

U.S. patent application Ser. No. 60/023,318, Provisional Patent Application, filed Jul. 30, 1996.

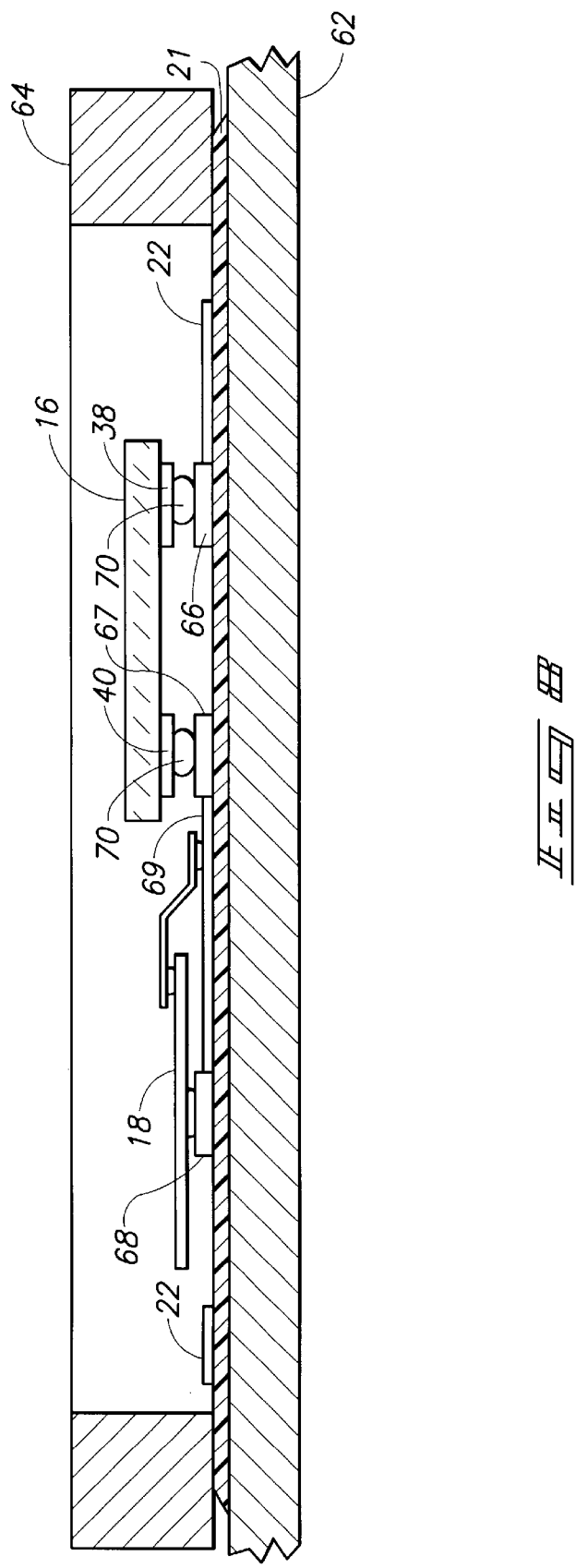

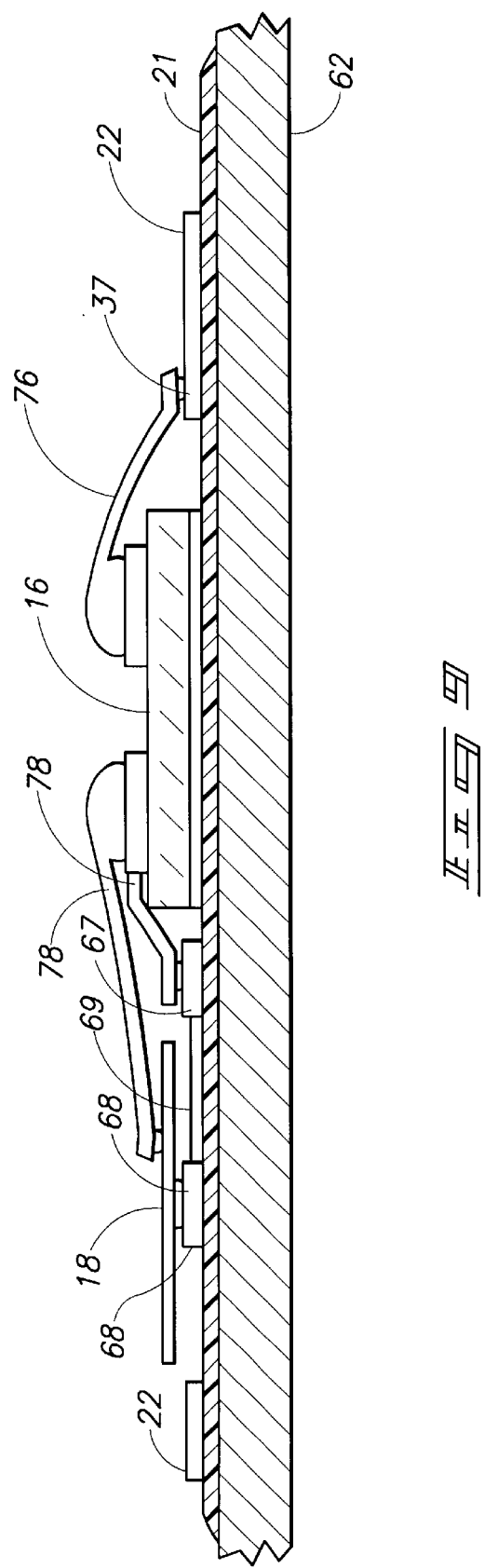

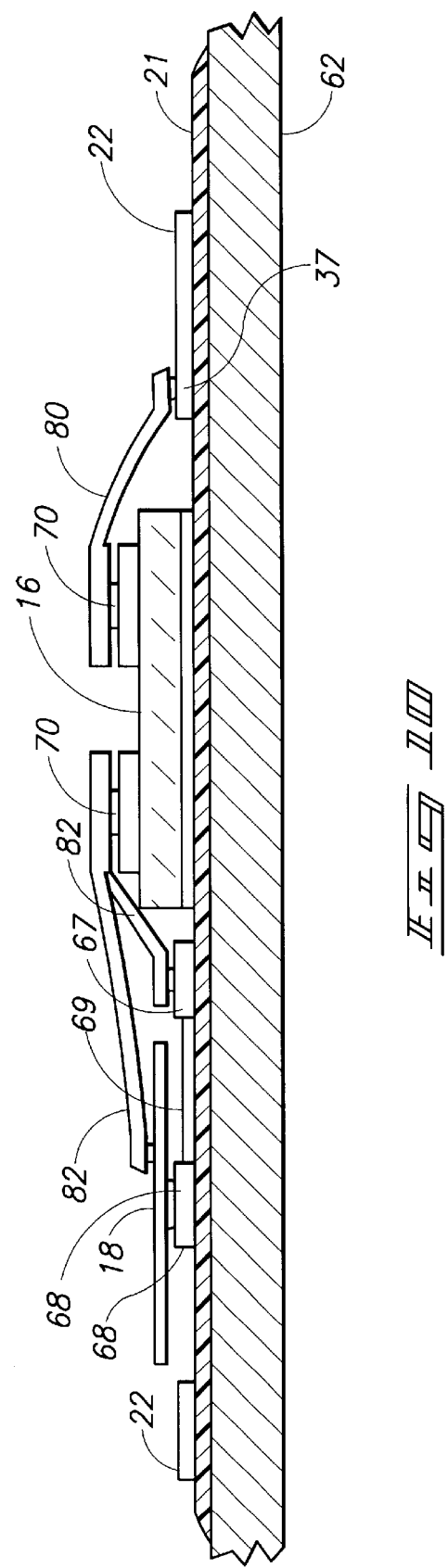

RADIO FREQUENCY DATA COMMUNICATIONS DEVICE WITH ADJUSTABLE RECEIVER SENSITIVITY AND METHOD

CROSS-REFERENCE TO RELATED APPLICATIONS

This application claims priority from a U.S. provisional application Ser. No. 60/023,321 filed Jul. 30, 1996, titled "Radio Frequency Data Communications Device with Adjustable Receiver Sensitivity and Method", and naming Mark E. Tuttle and John R. Tuttle as inventors.

This is a continuation application of U.S. patent application Ser. No. 09/961,204, now U.S. Pat. No. 6,509,837 filed Sep. 21, 2001, by Mark E. Tuttle and John R. Tuttle, entitled "Radio Frequency Data Communications Device with Adjustable Receiver Sensitivity and Method", which is a Divisional Application of Ser. No. 08/708,164, filed Aug. 29, 1996, now U.S. Pat. No. 6,466,131, granted Oct. 15, 2002.

TECHNICAL FIELD

This invention relates to radio frequency communication devices, and more particularly to an adjustable radio frequency interrogator tag and method of adjusting transponder sensitivity.

BACKGROUND OF THE INVENTION

As large numbers of objects are moved in inventory, product manufacturing, and merchandising operations, there is a continuous challenge to accurately monitor the location and flow of objects. Additionally, there is a continuing goal to interrogate the location of objects in an inexpensive and streamlined manner. Furthermore, there is a need for tag devices suitably configured to mount to a variety of objects including goods, items, persons, or animals, as well as any moving or stationary and animate or inanimate object. One way of tracking objects is with an electronic identification system.

One presently available electronic identification system utilizes a magnetic field modulation system to monitor tag devices. A controller or interrogator unit creates a magnetic field that becomes detuned when the tag device is passed through the magnetic field. In some cases, the tag device may be alternatively tuned and detuned in a sequence unique to the tag device in order to distinguish between a number of different tags, each having a distinct identify sequence. Typically, the tag devices are entirely passive, eliminating the need for a portable power supply which results in a small and portable package. However, this identification system is only capable of distinguishing a limited number of tag devices, over a relatively short range, limited by the size of the resulting magnetic field. Detuning is the means of encoding the identification number of the tag device or its data.

Another electronic identification system utilizes an RF transponder device affixed to an object to be monitored, in which a controller or interrogator unit transmits an interrogation signal to the device. The device receives the signal, then generates and transmits a responsive signal. The interrogation signal and the responsive signal are typically radio-frequency (RF) signals produced by an RF transmitter circuit. Since RF signals can be transmitted over greater distances than magnetic fields, RF-based transponder devices tend to be more suitable for applications requiring tracking of a tagged device that may not be in close proximity to an interrogator unit. However, when a large number of devices are utilized, the interrogator unit triggers frequent wake-up of each device. As a result, responsive signals are frequently generated. For the case of a battery powered device, the life of the battery is severely diminished due to frequent unintentional wake-ups of the device. Therefore, there is a need to produce tags having different receiver sensitivities, and to produce tags having either factory or user adjustable sensitivity. Such constructions are the subject of this invention.

BRIEF DESCRIPTION OF THE DRAWINGS

Preferred embodiments of the invention are described below with reference to the following accompanying drawings.

FIG. 7 is an enlarged partial view taken generally from encircled region 7 of FIG. 4 depicting a stepwise removed portion.

FIG. 8 is a diagrammatic side sectional view illustrating mounting of an integrated circuit, battery and antenna to the tag device of FIG. 2.

FIG. 9 is a diagrammatic side sectional view illustrating an alternative wire bonding technique for mounting the integrated circuit, battery and antenna to the tag device of FIG. 2.

FIG. 10 is a diagrammatic side sectional view illustrating another alternative mounting technique using tape automated bonding (TAB) of leads to electrically bond the integrated circuit, battery and antenna together on the tag device of FIG. 2.

DETAILED DESCRIPTION OF THE PREFERRED EMBODIMENTS

Figure 1:
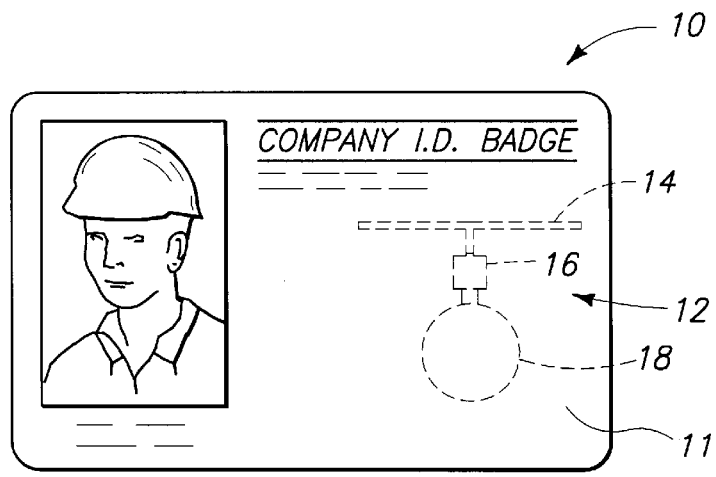
FIG. 1 is a front view of an employee badge providing the device of this invention.

This disclosure of the invention is submitted in furtherance of the constitutional purposes of the U.S. Patent Laws "to promote the progress of science and useful arts" (Article 1, Section 8).

According to an aspect of this invention, an adjustable radio frequency data communications device comprises:

a monolithic semiconductor integrated circuit having integrated circuitry; interrogation receiving circuitry provided on the monolithic integrated circuit forming at least part of the integrated circuitry and configured to receive an interrogation signal from the interrogator unit;

an antenna electrically coupled to the interrogation receiving circuitry and configured to communicate with the remote interrogator unit;

a power source electrically coupled to the integrated circuitry and configured to generate operating power for the communications device; and at least one of the antenna and the interrogation receiving circuitry having reconfigurable electrical characteristics, the electrical characteristics being reconfigurable to selectively tune the at least one of the antenna and the interrogation receiving circuitry within a range of tuned and detuned states to realize a desired receiver sensitivity of the communications device.

According to another aspect of this invention, an adjustable radio frequency data communications device comprises:

a monolithic semiconductor integrated circuit having integrated circuitry;

transmitter circuitry provided on the monolithic integrated circuit and forming at least part of the integrated circuitry;

an antenna electrically coupled to the transmitter circuitry and configured to communicate with the remote interrogator unit;

a power source electrically coupled to the integrated circuitry and configured to generate operating power for the communications device; and at least one of the antenna and the transmitter circuitry having reconfigurable electrical characteristics, the electrical characteristics being reconfigurable to selectively tune the at least one of the antenna and the transmitter circuitry within a range of tuned and detuned states to realize a desired transmitter sensitivity of the communications device.

According to a third aspect of this invention, an adjustable radio frequency data communications device comprises:

a printed circuit board having printed circuitry;

interrogation receiving circuitry provided on the circuit board electrically coupled to the integrated circuitry and configured to receive an interrogation signal from the interrogator unit;

an antenna electrically coupled to the interrogation receiving circuitry, the antenna configured to receive the interrogation signal from the interrogator unit and deliver the interrogation signal to the interrogation receiving circuitry;

a power source electrically coupled to the printed circuitry and configured to generate operating power for the communications device; and at least one of the antenna and the interrogation receiving circuitry having reconfigurable electrical characteristics, the electrical characteristics being reconfigurable to selectively tune at least one of the antenna and the interrogation receiving circuitry within a range of tuned and detuned states to realize a desired detuned receiver sensitivity of the communications device.

According to a fourth aspect of this invention, a method of adapting a radio frequency data communications device for use with a remote interrogator unit comprises the steps of:

providing transponder circuitry;

providing an antenna electrically coupled to the transponder circuitry for communicating with a remote interrogator unit; and selectively tuning at least one of the antenna and the transponder circuitry within a range of tuned and detuned states to realize a desired receiver sensitivity responsive to an interrogation signal transmitted by the interrogator unit.

Referring more particularly to the drawings, FIG. 1 illustrates an employee identification badge 10 embodying this invention. The badge of this invention in one embodiment has a radio-frequency data communication device 12 laminated to a back face of a plastic card 11, wherein the card forms the visible portion of the badge. Preferably, the communication device 12 is bonded to the back face of the card by embedding it within a thin bond line of epoxy-based material. Alternatively, the communication device 12 is embedded into the plastic card 11. The communication device 12 has an antenna 14 that is electrically connected with a transponder silicon-chip integrated circuit 16 to form a transmitting and receiving device. Additionally, the device has a battery 18 that is electrically connected to the integrated circuit in order to power the device when it is transmitting and receiving radio-frequency (RF) signals between itself and another device. Preferably, the front face of the badge also has visual identification features including an employee photograph as well as identifying text.

Preferably, the antenna 14 is constructed and arranged to form a folded dipole antenna, consisting of a continuous conductive path, or loop of microstrip. The terminal ends of the loop each form a conductive lead similar to leads 37 in FIG. 4 that electrically interconnects with a transponder circuit 30 on the integrated circuit 16, as depicted in use in an alternative embodiment in FIG. 4 and discussed in greater detail below. Alternatively, the antenna can be constructed as a continuous loop antenna 22, as depicted in FIGS. 2–3 and discussed in greater detail below.

Preferably, the battery 18 is a thin profile button-type battery forming a small, thin energy cell more commonly utilized in watches and small electronic devices requiring a thin profile. A conventional button-type battery has a pair of electrodes, an anode formed by one face and a cathode formed by an opposite face. Exemplary button-type batteries are disclosed in several pending U.S. patent applications including U.S. patent application Ser. No. 08/205,957, "Button-Type Battery Having Bendable Construction and Angled Button-Type Battery", listing Mark E. Tuttle and Peter M. Blonsky as inventors (now U.S. Pat. No. 5,432, 827); U.S. patent application Ser. No. 08/321,251, "Button-Type Batteries and Method of Forming Button-Type Batteries", listing Mark E. Tuttle as inventor (now U.S. Pat. No. 5,494,495); and U.S. patent application Ser. No. 08/348, 543, "Method of Forming Button-Type Batteries and a Button-Type Battery Insulating and Sealing Gasket", listing Mark E. Tuttle as inventor. These patent applications and resulting patents are hereby incorporated by reference as if fully included herein.

Figure 2:
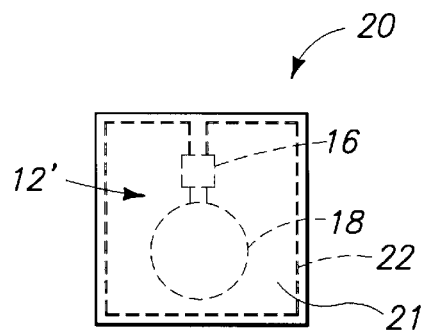
FIG. 2 is a front view of a radio frequency identification tag of this invention.

FIG. 2 depicts an alternative construction for a radio-frequency data communications device 12' constructed as an identification postage stamp 20. Device 12' has a semiconductor-based transponder integrated circuit 16, a battery 18, and an antenna 22. Preferably, the antenna is constructed from a continuous piece of conductive microstrip configured in the shape of a square to form a loop antenna. Preferably, the postage stamp is formed from a thin sheet, or card 21 of plastic material having a thickness of about 0.005 inches, and a final width and height, of about 1.25 inches. As was the case for the badge 10 of FIG. 1, preferably, the device 12' is bonded to a back face of the plastic card by embedding it in a thin layer of non-conductive epoxy material. The final thickness is about 0.030 inches. Further details of the construction will be discussed below with reference to FIG. 8.

Figure 3:
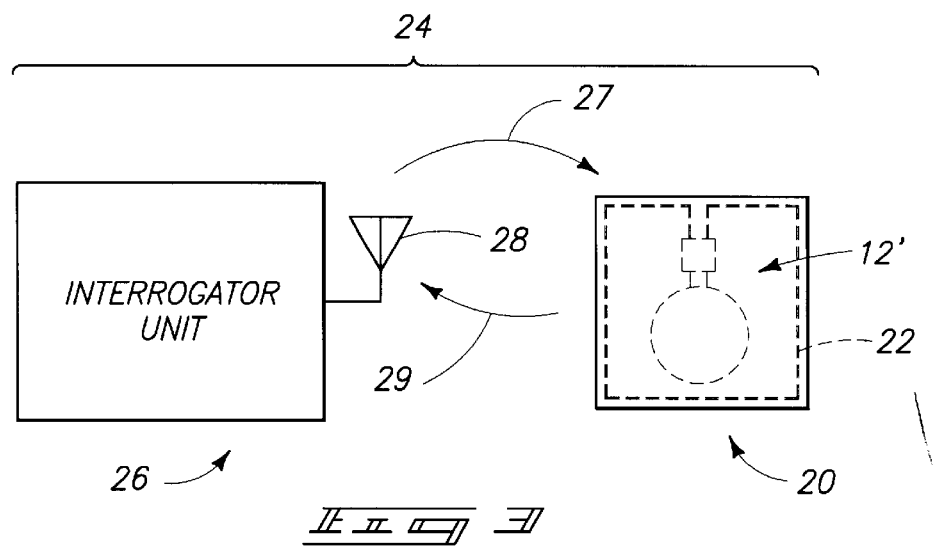
FIG. 3 is a block diagram of an electronic identification system illustrating communication between an interrogator unit and the tag of FIG. 2.

Preferably, the integrated circuit 16, antenna 22, and battery 18 form a transponder device capable of transmitting and receiving RF signals with a radio-frequency interrogator unit 26, shown in FIG. 3 as radio-frequency communication system 24. Preferably, the interrogator unit includes an antenna 28, as well as dedicated transmitting and receiving circuitry, similar to that implemented on integrated circuit 16. One example of an interrogator unit implemented in combination with a transponder unit is disclosed in U.S. Pat. No. 4,857,893, hereby incorporated by reference. Generally, the interrogator unit transmits an interrogation signal 27 via antenna 28. The transponder device 12', in this case stamp 20, receives the incoming interrogation signal with antenna 22. Upon receiving signal 27, device 12' preferably responds by generating and transmitting a responsive signal 29. Preferably, the responsive signal 29 is encoded with unique information that uniquely identifies, or labels the stamp 20, as well as any object on which the stamp is affixed.

With the above described interrogator/transponder communication system 24, a big benefit is provided over prior art devices that utilized magnetic field effect systems because a large number of uniquely identifiable tags can be constructed. With the old magnetic field effect systems, a passive element tag modified a magnetic field when moved in proximity to an interrogator unit, thereby allowing electronic identification and detection of the tag. However, in order to identify particular tags, each tag was alternately tuned and detuned in a certain sequence in order to distinguish it from other tags. It is easy to see that such a system has at best a very limited ability to discriminate between tags. In contrast, a large amount of information can be carried on the responsive signal 29, allowing for detailed description of the device 12'.

As a result, such a system 24 can be used, for example, to monitor large warehouse inventories having many unique products needing individual discrimination to determine the presence of particular items within a large lot of products. However, a significant problem is posed by such implementations where a battery is used to supply power to the devices since each time an interrogation signal 27 is received, each device within receiving range of the signal will "wake up", thereby consuming valuable power and reducing the life of the battery. Typically, the life of the device is also reduced commensurately since the battery is preferably permanently sealed inside either a badge 10, a stamp 20, or some other similar tag.

One reason for sealing the battery within the tag is to simplify the design and construction, as well as to reduce the cost of producing the tag. Another is to seal the battery within the tag, thereby protecting it from moisture and contaminants. A third reason is to enhance the cosmetic appeal of the tag by eliminating the need for an access port or door otherwise necessary to insert and remove the battery. When the battery is discharged, the entire badge or stamp is then discarded. Hence, it is desirable to maximize the life of the battery by minimizing power consumption.

Preferably, the transponder device 12' is electrically powered by a battery 18. In order to conserve the power supplied from battery 18, preferably, device 12' goes into a sleep, or battery conserving stand-by mode of operation during long time periods where no interrogation signal 27 is received by the device. Preferably, a low current circuit periodically wakes up the device every sixteen milliseconds in order to check if any RF signals are being detected by the device. Upon detection of such signals, the device fully wakes up, returning it to a full power operating mode. In order to further extend the life of battery 18, the receiver sensitivity of the transponder device 12' is preferably tuned over a range of tuned and detuned states in order to modify the ability of the device to detect signal 27, and therefore adjust the tendency for the device to wake up.

Preferably, the receiver sensitivity of the device is adjusted by reconfiguring the electrical characteristics (circuitry) of the circuit forming the transponder device. One way to adjust the receiver sensitivity is to adjust the sensitivity, or impedance of the antenna. Another way is to adjust or switch in different circuit elements in the transponder device, thereby realizing different circuit configurations. Additionally, the transmitting sensitivity for the transponder device can be adjusted in essentially the same manner. Techniques of this invention for adjusting the transmitting and receiving sensitivities for an antenna will be discussed below with reference to implementations depicted generally in FIGS. 4–7. Techniques of this invention for adjusting the transmitting and receiving sensitivities for circuit elements of the transponder device will also be discussed below with reference to implementations depicted generally in FIGS. 4 and 5.

Figure 4:
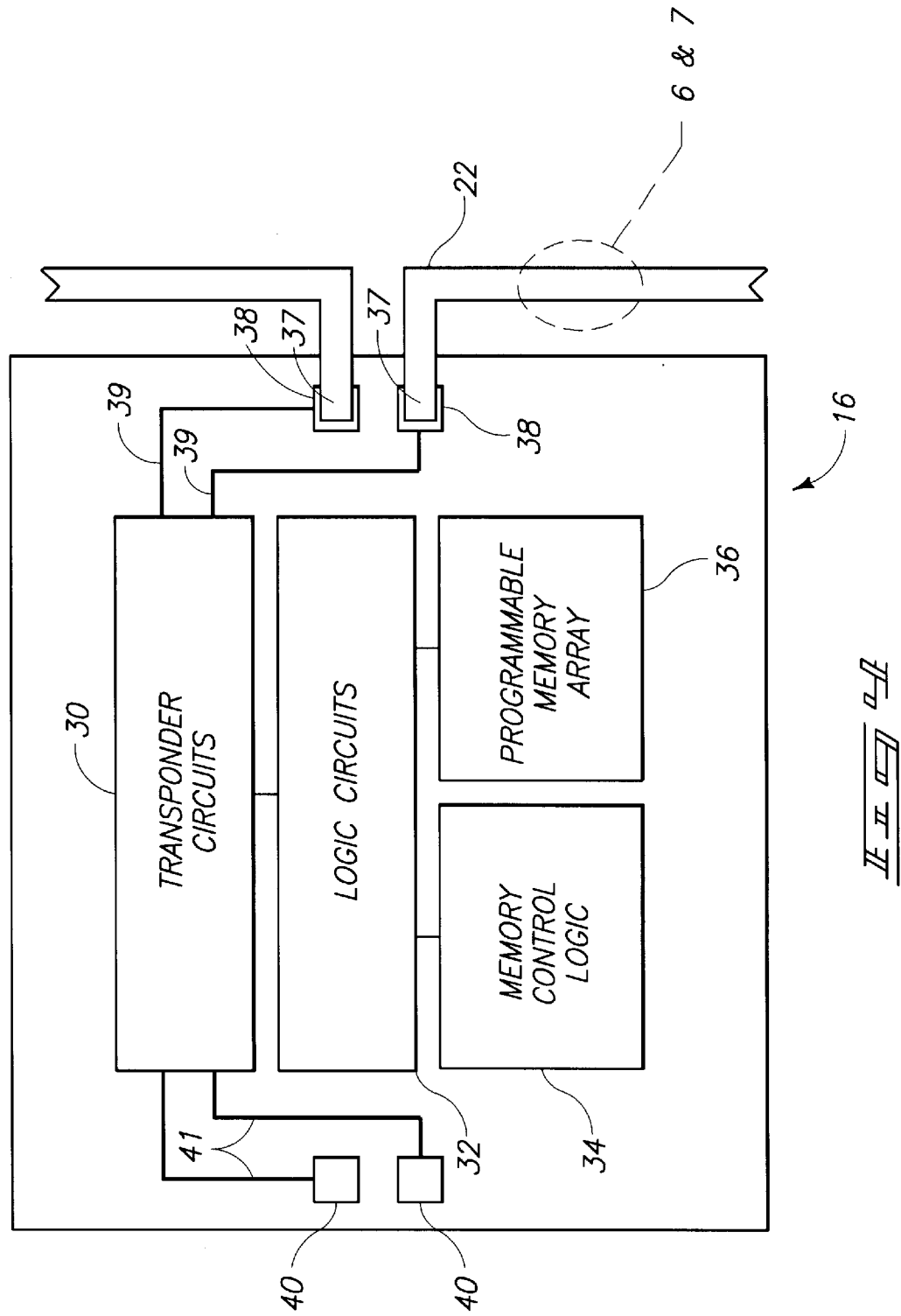
FIG. 4 is a plan view of a monolithic semiconductor integrated circuit utilized in the device of FIG. 2 illustrating an integrated circuitry layout configured for use with a hybrid antenna.

FIG. 4 depicts the particular construction of integrated circuit 16 as implemented on the devices 10 and 20 of FIGS. 1 and 2, respectively. As shown in FIG. 4, the integrated circuit is formed from a single monolithic silicon chip construction wherein the integrated circuit, or wafer receives an array of transponder circuits 30, logic circuits 32, memory control logic circuits 34, and a programmable memory array 36 according to standard semiconductor wafer processing steps. Additionally, pairs of conductive die pads 38 and 40 are formed on the integrated circuit in order to facilitate electrical connection with the antenna 22 and battery 18, respectively. Preferably, circuits 30 are electrically coupled with the conductive die pads 38 and 40 by way of sections of conductive microstrip 39 and 41, respectively.

For illustrative purposes, antenna 22 is depicted in electrically conductive and bonded relationship with pads 38 via legs 37, although the preferred assembly technique, illustrated in FIG. 8 and discussed below, involves a flip-chip epoxy bonding technique wherein the antenna 22 is actually printed onto the back face of the plastic card 21 forming the postage stamp 20, after which the integrated circuit is bonded to the antenna, as well as to the battery, using a conductive epoxy.

FIG. 4 depicts the relationship of the transponder circuits 30 relative to antenna 22 which electrically connects directly to the transponder circuits, and the battery (not illustrated in this Figure), and which also electrically connects directly to the transponder circuits. Preferably, the logic circuits 32, the memory control logic 34, and the programmable memory array 36 electrically connect with the transponder circuits 30. In this manner, battery 18, once electrically connected to pads 40, powers all of the circuits 30–36.

According to one technique for tuning the transceiving sensitivity of a device 12' carried by a tag, for example stamp 20, the antenna is laser trimmed after it is formed in order to reconfigure a conductive portion of the integrated circuit, thereby modifying the transceiving sensitivity of the device 12' by changing its impedance. For purposes of this disclosure, transceiving sensitivity includes transmitter and receiver sensitivity. Alternatively, just the transmitting sensitivity or the receiving sensitivity can be tuned. Further alternatively, separate transmitting and receiving antennas can be independently tuned. For example, a receive antenna and a separate backscatter transmit antenna can be used, and for one case, just the receive antenna is trimmed in order to tune it. Furthermore, for purposes of this disclosure, tuning refers to either tuning or detuning a radio-frequency transponder device. Finally, adjustment of the antenna impedance relative to the impedance of the transponder circuits imparts a tuning to the combined electrical circuit. For example, when the antenna impedance matches the transponder circuit impedance and the two are connected in series, the circuit is optimally tuned. Similarly, various degrees of impedance mis-matching produce corresponding levels of detuning.

Preferably, transponder circuit 30, logic circuits 32 and memory control logic 34 are implemented as a combination of hardware circuit elements and software. With respect to the software components, preferably, the software is implemented in the programmable memory array 36.

Figure 6:
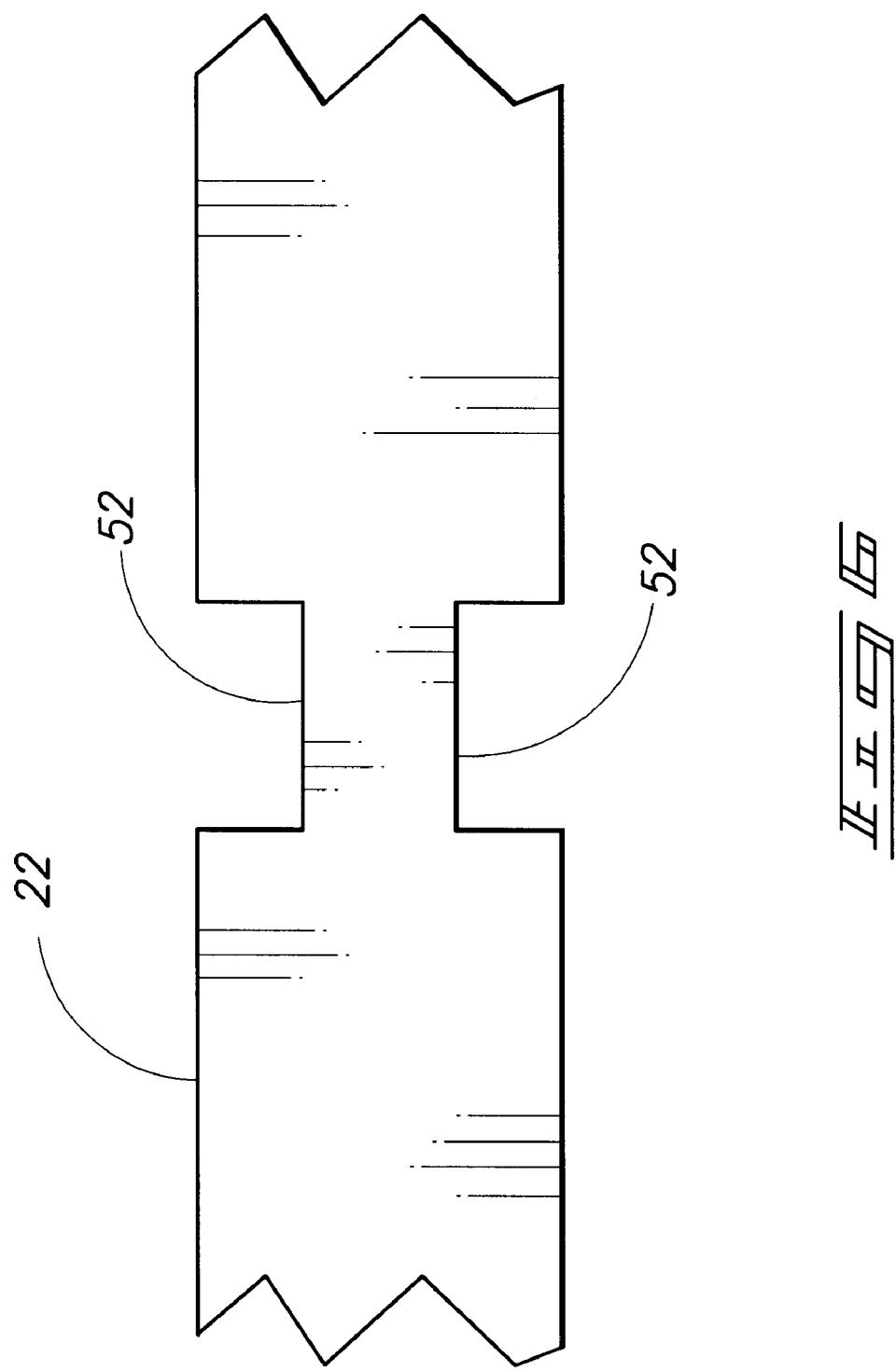
FIG. 6 is an enlarged partial view taken generally from encircled region 6 of FIG. 4 depicting a discretely slit portion.
Figure 11:
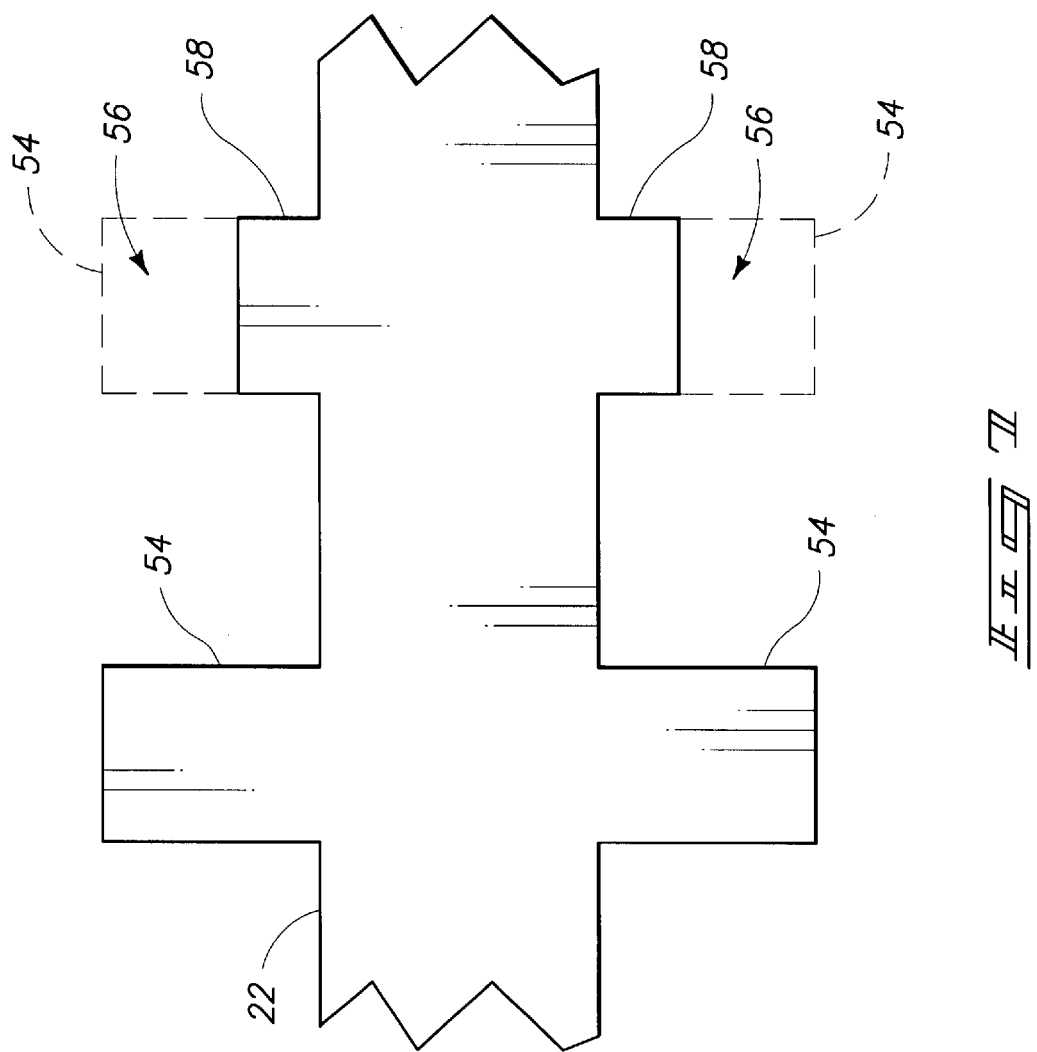

FIG. 6 depicts one method for tuning the antenna 22 of FIG. 4, wherein a portion of conductive microstrip forming the antenna is selectively removed along each edge with a laser, forming a transverse slit 52. The resulting step-width change in the microstrip antenna causes a change in impedance, thereby changing the tuned state of the antenna from the originally produced state. In this manner, a large lot of identical antennas can be mass produced at the factory, after which the antennas can be laser trimmed to create batches of antennas having tailored tuned characteristics, e.g. specific receiving sensitivities.

Preferably, the antenna 22 of FIGS. 4 and 6–7 is printed onto the back side of card 21, forming the microstrip loop antenna. For example, the antenna can be silk screened onto the card with a conductive polymer thick film. Alternatively, a conductive silver filled epoxy can be used. Further details of this construction will be provided below when describing FIG. 8. Alternatively, the antenna can be formed from a separate piece of conductive material, for example, from a piece of wire or conductive ribbon that is glued to the back of the card.

FIG. 7 illustrates another method for tuning the antenna of FIG. 4, wherein the microstrip antenna is produced with widened regions, forming laterally extending pairs of stubs 54. The pairs of stubs impart changes in the impedance of the resulting antenna 22. Additionally, the stubs facilitate laser removal of portions 56, leaving enshortened stubs 58. As a result, the impedance of the antenna 22 can be changed, thereby tuning the antenna based on the amount of conductive material removed from portions 56, as well as from the number of portions 56 removed from an array along the microstrip.

Figure 5:
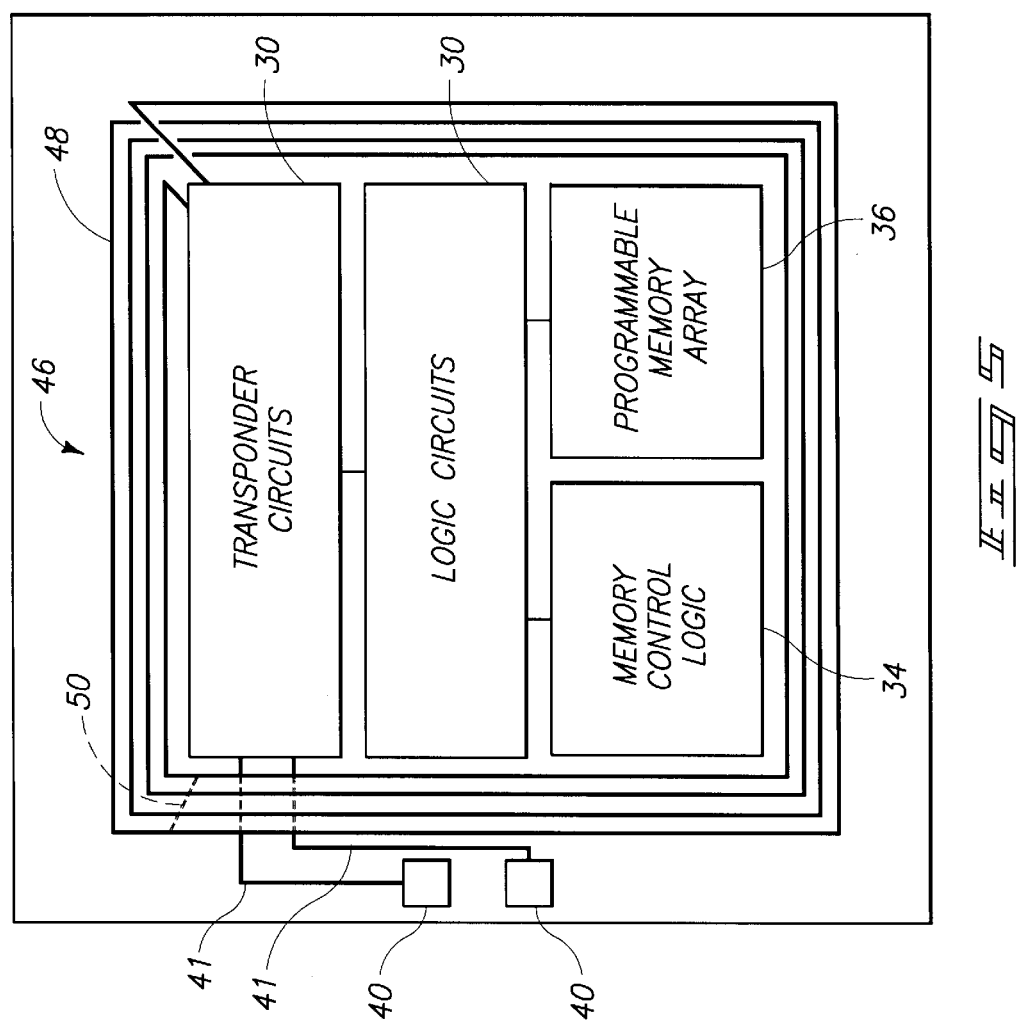
FIG. 5 is an alternative construction of a monolithic semiconductor integrated circuit from that depicted in FIG. 4, wherein the antenna is formed directly on the integrated circuit.

FIG. 5 illustrates a third method for tuning an antenna on a semiconductor transponder integrated circuit 46 having a coil-shaped antenna 48 formed directly on the integrated circuit in the form of microstrip with one of several presently known standard semiconductor deposition techniques. Antenna 48 is preferably formed with a conductive bridge line 50 similar to conductive microstrip lines 39 and 41 that shunts conduction between adjacent coils of the antenna. After the antenna is produced, at least part of the conductive bridge line 50 can be removed, either mechanically or by laser trimming in order to tune the antenna to a desired state. By selectively cutting the bridge line 50, the effective conducting length of the antenna is modified, realizing one or several possible length antennas defined by the number and size of each coil, and any remaining portion of the bridge. Preferably, an insulating layer of material is deposited on top of conductive leads 41 during manufacture in order to insulate the leads from shorting out coils on the antenna 48. Alternatively, numeral 46 of FIG. 5 can represent a printed circuit board having integrated circuitry and hybrid circuit elements attached to the circuitry, forming the circuits 30–36 and antenna 48. For a device of this invention implemented on a printed circuit board, the inventive contribution consists of intentionally detuning the transponder sensitivity of the tag device.

For the case where the receiver sensitivity of the device is adjusted by reconfiguring the transponder circuits, the receiver sensitivity can be modified by electrically modifying the receiver circuit on the integrated circuit itself. For example, a plurality of parallel circuits, each having a different impedance or amplification factor are alternately switched into an electrically conductive configuration within the transponder circuit. Essentially, different fixed matching networks can be alternately switched into connection within the circuit.

One way to achieve the switching is to provide temporary contact connections on the integrated circuit (not shown) for forming a temporary electrical connection at the factory, allowing for factory setup of one of the matching networks within circuits 30 to realize a specific tuned condition for a transponder device 12. For example, an array of resistive and/or capacitive elements can be provided on parallel circuit legs, each configured with a physical switch for connecting and disconnecting the leg from the transponder circuit, such that each leg imparts a different circuit impedance, and hence, a different tuning. Another way is to implement a software switching routine that allows either factory or user switching of different circuit implementations within the transponder circuits 30, with actual circuit elements or with a software routine implemented in memory 36 and triggered by interrogation signals 27 received from the interrogator unit 26 depicted in FIG. 3 to realize a software-based circuit implementation. Additionally, each circuit leg can have an amplifier configured to impart a distinct tuning level to the circuit when switched into connection with the circuit. Hence, the transponder circuit realized on the integrated circuit is modified to change the circuit impedance, thereby realizing a different receiving sensitivity for the device. The same technique can be used to tune the transmitting sensitivity. Additionally, a hybrid element such as a trim pot can be connected to the circuits 30 of the integrated circuit to allow adjustment, or tuning of the circuits by either a manufacturer or a user.

Another reason for providing a tuning feature on RF data communication devices such as tags 10 and 20 is to allow a manufacturer to produce large lots of identical integrated circuits and antennas, thereby enabling a cost savings resulting from large scales of production. Furthermore, by producing runs of identical devices, variables can be better controlled, enabling production of more uniform product which increases the amount of acceptable yield. After manufacture, the integrated circuits and/or antennas can be tuned by one of the techniques of this invention in order to create tuned tag devices having particular receiving and/or transmitting sensitivities.

For example, stamps 20 can be mass produced, then the antenna 22 can be tuned to impart one of three receiver sensitivities of 5 feet, 20 feet or 100 feet. One customer may need tags having only one of the above operating ranges. Another customer may need all three, placing the least sensitive tags on objects where frequent inadvertent wake up calls from an interrogator are undesirable. When it is necessary to wake up the device, the interrogator is positioned within the five foot range in order to activate the device, resulting in a responsive signal 29. Additional applications requiring employee badges 10 having varying degrees of receiver sensitivity can easily be envisioned.

FIG. 8 shows an exemplary technique for assembling the postage stamp 20. The same technique can be used to assemble the badge 10 or any other similarly constructed tag having a rigid support or substrate similar to plastic cards 11 and 21. First, antenna 22, conductive pads 66–68 and conductive microstrip leads 69 are printed onto a back face of the sheet of material. Preferably, the above elements, or conductors are simultaneously printed onto the back of a large sheet of plastic material with a conductive silver printed thick film. Later, the cards are individually separated (after complete assembly), or cut from the sheet. Pads 66 form enlarged connection points for the antenna 22, in contrast to the pads 37 formed directly from the end portions of the antenna 22 in FIG. 4. Next, the sheet is positioned front face down onto a rigid support plate 62. Then integrated circuit, or chip 16 is mounted to pads 66 and 67 with conductive beads of epoxy 70. Finally, the battery 18 is bonded along its bottom face with a bead of conductive epoxy 70 to the sheet, on each card, after which conductive epoxy 70 is used to electrically connect the opposite terminal or top of the battery with a corresponding conductive die pad 68. The antennas and electrical components are then electrically tested and/or trimmed, if necessary, prior to being encapsulated.

Subsequently, a bead of hot melt glue forming a dam 64 sized to conform generally to the outer peripheral shape of the sheet 21 is placed over the back of the card. The dam functions as an outer template while a thin layer of non-conductive epoxy (not shown) is applied to the back of the sheet 21, preferably hermetically sealing in (or encapsulating) the integrated circuit, antenna and battery. Subsequently, the sheet is separated, or singulated to form separate cards. In this manner, a large number of devices are assembled onto a single sheet, after which they are separated. Preferably, the thin coat of epoxy consists of a coating, barely thick enough to cover over the components forming the device 12'. One benefit provided by this construction technique is the elimination of any visible bumps in the tag which can result when constructing the tag by heat sealing two or more pieces of plastic card together to trap the device 12' therein. However, a lesser preferred construction of this invention envisions forming the tag, e.g. badge 10, stamp 20, or some other tag, with such a heat sealed sandwich of plastic cards. Furthermore, for constructions using a printed circuit board, the tag can be formed from a case inside of which the board is mounted.

Preferably, the above technique for mounting integrated circuit 16 to card 21 consists of a flip-chip mounting technique. One example of a flip-chip mounting technique is disclosed in pending U.S. patent application Ser. No. 08/166,747, "Process of Manufacturing an Electrical Bonding Interconnect Having a Metal Bond Pad Portion and Having a Conductive Epoxy Portion Comprising an Oxide Reducing Agent", listing Rickie C. Lake and Mark E. Tuttle as inventors (now U.S. Pat. No. 5,480,834), and herein incorporated by reference.

FIG. 9 depicts an alternative method for electrically connecting the integrated circuit 16 to the antenna 22 and battery 18 with conductive wires. In this construction, the integrated circuit 16 is adhesively bonded to the back face of card 21, between the bonding pads 37 of the antenna 22 and the battery 18. Similarly, the battery 18 is bonded along a bottom face to pad 68. Subsequently, a wire 76 and 78 is used to connect each of the integrated circuit pads 38 and 40, respectively, to antenna bonding pads 37 and the top and bottom of battery 18, respectively. Preferably, each wire is soldered to the associated pads and battery. Alternatively, the wires can be electrically mounted using conductive epoxy.

FIG. 10 depicts another alternative method for electrically connecting the integrated circuit 16 to the antenna 22 and battery 18 with conductive leads 80 and 82, respectively. Preferably, one end of each lead 80 and 82 is bonded to a pad 38 and 40 on the integrated circuit, respectively, and the other end is bonded to pad 37, and pad 67 and the top of battery 18, respectively, using conductive epoxy. Alternatively, the leads can be soldered at each end to the respective components. Preferably, the battery is bonded to the back face of card 21 by applying conductive adhesive between the battery and pad 68. Preferably, the integrated circuit is bonded along a bottom face to the back side of card 21.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of manufacturing a radio frequency data communications device, for use with a remote interrogator unit, the method comprising:

providing an RFID integrated circuit, including a package housing transponder circuitry, and supporting the integrated circuit on a substrate, the integrated circuit being configured to transmit, in response to an interrogation signal from a remote interrogator, a responsive signal which includes identification information;

securing an antenna on the substrate external of the transponder circuitry and electrically coupling the antenna to the integrated circuit, the antenna having a length, and a width transverse to the length;

purposefully reducing the sensitivity of the transponder circuitry of the integrated circuit by trimming the antenna to reduce the width of at least a portion of a section at a location along the length of the antenna, while the antenna is on the substrate; and supporting a battery from the substrate and coupling the battery to the integrated circuit, wherein reducing the sensitivity of the transponder circuitry comprises setting a range of twenty feet for the transponder circuitry, increasing duration of an interval during which the transponder circuitry is not able to detect a wake-up signal and conserving battery power.

2. A method in accordance with claim 1 and further comprising permanently encapsulating the battery, the RFID integrated circuit and the antenna.

3. A method of manufacturing a radio frequency data communications device, for use with a remote interrogator unit, the method comprising:

providing an RFID integrated circuit, including a package housing transponder circuitry, and supporting the integrated circuit on a substrate, the integrated circuit being configured to transmit, in response to an interrogation signal from a remote interrogator, a responsive signal which includes identification information;

supporting an antenna on the substrate external of the transponder circuitry, and electrically coupling the antenna to the integrated circuit, the antenna having a length, and a width transverse to the length;

purposefully reducing the sensitivity of the transponder circuitry of the integrated circuit by trimming the antenna to reduce the width of at least a portion of a section at a location along the length of the antenna, while the antenna is on the substrate; and supporting a battery from the substrate and coupling the battery to the integrated circuit.

4. A method in accordance with claim 3 and further comprising permanently encapsulating the battery, the RFID integrated circuit and the antenna.

5. A method of manufacturing a radio frequency data communications device, for use with a remote interrogator unit, the method comprising:

providing first transponder circuitry on a sheet substrate; printing an antenna on the sheet substrate, external of the transponder circuitry, and electrically coupling the antenna to the transponder circuitry; providing a battery on the substrate and electrically coupling the battery to the first transponder circuitry; and trimming the antenna by a first amount, while the antenna is on the substrate, to effect a first sensitivity; and providing second transponder circuitry on a second sheet substrate; printing a second antenna using printed thick film, on the second sheet substrate, external of the second transponder circuitry, and electrically coupling the second antenna to the second transponder circuitry; providing a second battery on the second sheet substrate and electrically coupling the second battery to the second transponder circuitry; and trimming the second antenna, while the second antenna is on the second sheet substrate, by an amount different from the first amount to effect a second sensitivity different from the first sensitivity, wherein trimming the antenna by the first amount comprises setting a transmission distance for the first transponder circuitry.

6. A method in accordance with claim 5 wherein providing the first transponder circuitry and providing the second transponder circuitry comprises providing integrated circuits comprising transponder circuitry.

7. A method in accordance with claim 5 wherein trimming the second antenna comprises setting a range of twenty feet for the second transponder circuitry, increasing duration of an interval during which the second transponder circuitry is not able to detect a wake-up signal and conserving battery power.

8. A method in accordance with claim 5 and further comprising sealing together the first transponder circuitry, the antenna and the battery.

9. A method of manufacturing a radio frequency data communications device, for use with a remote interrogator unit, the method comprising:

providing transponder circuitry on a substrate; forming a first antenna, having a first sensitivity, on the substrate, external of the transponder circuitry, and electrically coupling the antenna to the transponder circuitry; providing a battery on the substrate and electrically coupling the battery to the transponder circuitry; and trimming the antenna by a first amount, while the antenna is on the substrate, and setting the transponder circuitry for operation at a predetermined frequency; and providing second transponder circuitry on a second substrate; forming a second antenna, having a second sensitivity different than the first sensitivity, on the second substrate, external of the second transponder circuitry, and electrically coupling the second antenna to the second transponder circuitry; providing a second battery on the second substrate and electrically coupling the second battery to the second transponder circuitry; and setting the second transponder circuitry for operation at the predetermined frequency, wherein setting the first sensitivity results in limiting the range for the first transponder circuitry.

10. A method in accordance with claim 9 wherein setting the first sensitivity results in increasing duration of an interval during which the first transponder circuitry is not able to detect a wake-up signal.

11. A method in accordance with claim 9 further comprising sealing the transponder circuitry, the antenna and the battery on the substrate.

12. A method of manufacturing a radio frequency data communications device, for use with a remote interrogator unit, the method comprising:

providing an RFID integrated circuit, including a package housing transponder circuitry, the integrated circuit being configured to transmit, in response to an interrogation by a remote interrogator, a responsive signal which includes identification information;

printing a conductive plastic microstrip antenna on the substrate, using conductive epoxy, external of the transponder circuitry and electrically coupling the microstrip antenna to the integrated circuit external of the integrated circuit, the microstrip antenna having a length, and a width transverse to the length;

reducing the sensitivity of the transponder circuitry of the integrated circuit by trimming the microstrip antenna to reduce the width of at least a portion of the section at a location along the length between the opposite ends, while the microstrip antenna is on the substrate; and supporting a battery from the substrate and coupling the battery to the integrated circuit using conductive epoxy, wherein purposefully reducing the sensitivity of the transponder circuitry results in setting a range for the transponder circuitry.

13. A method in accordance with claim 12 and further comprising permanently sealing the RFID integrated circuit, the microstrip antenna and the battery in the package.

14. A method of manufacturing a radio frequency data communications device, for use with a remote interrogator unit, the method comprising:

providing an RFID integrated circuit, including a package housing transponder circuitry, and adhesively bonding the integrated circuit on a substrate, the integrated circuit being configured to transmit, in response to an interrogation by a remote interrogator, a responsive signal which includes identification information;

printing a generally planar dipole conductive antenna on the substrate, using conductive epoxy, external of the transponder circuitry and electrically coupling the antenna to the integrated circuit, external of the integrated circuit, the antenna having a length, and a width transverse to the length;

purposefully reducing the sensitivity of the transponder circuitry of the integrated circuit by trimming the antenna to reduce the width of at least a portion of the section at a location along the length between the opposite ends, while the antenna is on the substrate; and supporting a battery from the substrate and coupling the battery to the integrated circuit using conductive epoxy, wherein reducing the sensitivity varies transmission distance of the transponder circuitry.

15. A method in accordance with claim 14 wherein the battery has a terminal and wherein the coupling of the battery to the integrated circuit comprises coupling a contact pad to the conductive epoxy and placing the terminal in contact with the conductive pad.

16. A method in accordance with claim 14 and further comprising permanently sealing the RFID integrated circuit, the antenna and the battery within the package.

17. A method of manufacturing a radio frequency data communications device, for use with a remote interrogator unit, the method comprising:
- providing an RFID integrated circuit, including a package housing transponder circuitry, and supporting the integrated circuit on a substrate, the integrated circuit being configured to transmit, in response to an interrogation signal from a remote interrogator, a responsive signal which includes identification information;
- printing a conductive antenna on the substrate, using conductive epoxy, external of the transponder circuitry and electrically coupling the antenna to the integrated circuit, external of the integrated circuit, the antenna having a length, and a width transverse to the length;
- purposefully reducing the sensitivity of the transponder circuitry of the integrated circuit by trimming the antenna to reduce the width of at least a portion of a section at a location along the length of the antenna, while the antenna is on the substrate;
- supporting a battery from the substrate and coupling the battery to the integrated circuit using conductive epoxy; and
- permanently hermetically encapsulating the battery, the RFID integrated circuit and the antenna on the substrate, wherein reducing the sensitivity of the transponder circuitry results in reducing the range for the transponder circuitry relative to what the range would be without reducing the sensitivity.

18. A method of manufacturing a radio frequency data communications device, for use with a remote interrogator unit, the method comprising:
- providing a first transponder circuitry and a first antenna on a sheet substrate;
- electrically coupling the first antenna to the transponder circuitry;
- providing second transponder circuitry and a second antenna on a second sheet substrate;
- electrically coupling the second antenna to the second transponder circuitry; and
- trimming the first and second antennas by differing amounts to effect differing sensitivities of the respective first and second antennas and to vary transmission distances for the respective first and second transponder circuitry.

19. The method of claim 18 wherein trimming the first and second antennas comprise laser trimming.

20. The method of claim 18 wherein providing the first and second antennas comprise providing first and second microstrip antennas.

21. A radio frequency data communications device for use with a remote interrogator unit, comprising:
- a first transponder circuitry provided on a first sheet substrate;
- a first antenna formed on the first sheet substrate and electrically coupled to the first transponder circuitry;
- a second transponder circuitry provided on a second sheet substrate;
- a second antenna formed on the second sheet substrate and electrically coupled to the second transponder circuitry; and
- wherein the first and second antennas are trimmed by differing amounts to effect differing sensitivities of the respective first and second antennas, the differing sensitivities corresponding to differing transmission distances for the respective first and second transponder circuitry.

22. The apparatus of claims 21 wherein the first and second antennas are laser trimmed.

23. The apparatus of claim 21 wherein the first and second antennas comprise microstrip antennas.

* * * * *

UNITED STATES PATENT AND TRADEMARK OFFICE
CERTIFICATE OF CORRECTION

PATENT NO.   : 6,781,508 B2
DATED        : August 24, 2004
INVENTOR(S)  : Mark E. Tuttle et al.

It is certified that error appears in the above-identified patent and that said Letters Patent is hereby corrected as shown below:

Title page,
Item [73], please insert -- [73] Assignee: Micron Technology, Inc., Boise, ID (US) --
Item [57], ABSTRACT,
Line 17, please insert -- Additionally, a method for tuning receiver sensitivity and/or transmitter sensitivity according to construction of the above device is disclosed. --.

Column 14,
Line 34, please delete "claims" after "apparatus of" and insert -- claim --.

Signed and Sealed this

Twelfth Day of April, 2005

JON W. DUDAS
*Director of the United States Patent and Trademark Office*